(12) United States Patent
Pai

(10) Patent No.: US 9,263,998 B2
(45) Date of Patent: Feb. 16, 2016

(54) BROADBAND SINGLE-ENDED INPUT TO DIFFERENTIAL OUTPUT LOW-NOISE AMPLIFIER

(71) Applicant: MStar Semiconductor, Inc., Hsinchu Hsien (TW)

(72) Inventor: Hung-Chuan Pai, Irvine, CA (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 45 days.

(21) Appl. No.: 14/107,478

(22) Filed: Dec. 16, 2013

(65) Prior Publication Data

US 2015/0171803 A1 Jun. 18, 2015

(51) Int. Cl.

| | |
|---|---|
| *H03F 3/04* | (2006.01) |
| *H03F 3/193* | (2006.01) |
| *H03F 1/22* | (2006.01) |
| *H03F 1/34* | (2006.01) |
| *H03F 3/21* | (2006.01) |
| *H03F 3/72* | (2006.01) |

(52) U.S. Cl.
CPC ............... *H03F 3/193* (2013.01); *H03F 1/223* (2013.01); *H03F 1/342* (2013.01); *H03F 3/211* (2013.01); *H03F 3/72* (2013.01); *H03F 2200/09* (2013.01); *H03F 2200/156* (2013.01); *H03F 2200/294* (2013.01); *H03F 2200/321* (2013.01); *H03F 2203/7227* (2013.01)

(58) Field of Classification Search
CPC ....... H03F 3/45475; H03F 1/34; H03F 3/193; H03F 3/211; H03F 2200/294; H03F 2203/45528; H03F 1/223; H03F 1/3211; H03F 2200/451; H03F 2203/45526; H03F 1/301; H03F 2203/45511; H03F 3/187

USPC ............ 330/85, 116, 117, 253, 260, 275, 301
See application file for complete search history.

(56) References Cited

U.S. PATENT DOCUMENTS

| 7,884,673 B2 | 2/2011 | Han et al. ...................... 330/301 |
| 2013/0315348 A1 | 11/2013 | Tasic et al. .................... 375/340 |

OTHER PUBLICATIONS

Kim et al., "A 13-dB IIP3 Improved Low-Power CMOS RF Programmable Gain Amplifier Using Differential Circuit Transconductance Linearization for Various Terrestrial Mobile D-TV Applications", IEEE Journal of Solid-State Circuits, vol. 41, No. 4, Apr. 2006, pp. 945-953.

Lerstaveesin, et al., "A 48-860 MHz CMOS Low-If Direct-Conversion DTV Tuner", IEEE Journal of Solid-State Circuits, vol. 43, No. 9, Sep. 2008, pp. 2013-2024.

*Primary Examiner* — Khanh V Nguyen
(74) *Attorney, Agent, or Firm* — Edell, Shapiro & Finnan, LLC

(57) ABSTRACT

A low-noise amplifier accepts a single-ended input signal at an input port and provides a differential output signal at an output port. Each of a pair of transistors in the amplifier has a pair of input terminals and a pair of output terminals that share a common terminal. A feedback circuit is electrically connected between the non-common output terminal and the non-common input terminal of a closed-loop one of the transistors and is electrically disconnected from any two terminals of an open-loop one of the transistors. The input port has a signal-carrying input terminal electrically connected to the non-common input terminal of both of the transistors and a ground terminal. The output port has a positive terminal electrically connected to the common terminal of the open-loop transistor and a negative terminal electrically connected to non-common output terminal of the closed-loop transistor.

20 Claims, 8 Drawing Sheets

BROADBAND SINGLE-ENDED INPUT TO DIFFERENTIAL OUTPUT LOW-NOISE AMPLIFIER

TECHNICAL FIELD

The present disclosure relates to low-noise amplifiers in radio-frequency communication apparatuses.

BACKGROUND

Low-noise amplifiers (LNAs) are among the first signal processing components in a radio-frequency (RF) receiver chain. Typically, the target information-bearing signals arriving at the input of an LNA are weak and corrupted by noise. A well-designed LNA boosts the signal power of the incoming signal while minimizing the production of amplifier-induced artifacts, e.g., amplifier-generated noise and distortion, in the amplified signal. Thus, in addition to characteristics of any good signal amplifier, e.g., linear gain, stability and impedance-matched over the operating bandwidth, a good LNA must also have a low noise figure (NF) and high intermodulation and compression points.

The front-end of the receiver chain is often connected to an unbalanced transmission line on which a ground-referenced signal is delivered, which presents an interface problem in those modern RF receivers that implement differential signaling. Differential signaling, where the target signal's amplitude is the potential difference between two time-varying signal components, offers several advantages, not the least of which is cancellation of common mode noise. A common solution to adapting a single-ended signaling system, such as an unbalanced transmission line, to a receiver employing differential signaling is to install a balanced-unbalanced transformer, commonly referred to as a "balun" at or near the interface. However, this solution not only increases the receiver's size, complexity and cost, but conventional baluns are band-limited. Consequently, when the receiver is expected to accept signals that span a wide spectral region, conventional implementations incorporate multiple baluns, each to accommodate a sub-band of the target spectrum. Traditional television tuners, for example, operate in the very-high frequency (VHF) television broadcast band, which, in the US, spans the RF frequencies between 54 and 216 MHz and the ultra-high frequency (UHF) television broadcast band, which spans 470 MHz-806 MHz. The input circuitry in such television tuners is often composed of separate circuits for VHF and UHF bands, each with its own balun, LNA and, often downconverter.

Ongoing development efforts in radio front-end technology seek robust designs for broadband LNA circuits that can be situated at the single-ended to differential signaling interface with minimal size and cost.

SUMMARY

Each of a pair of transistors in a low-noise amplifier has a pair of input terminals between which an input voltage signal is applied. Each of the transistors also has a pair of output terminals between which a current flows in proportion to the input voltage signal. The input terminals and the output terminals of each of the transistors have a common terminal that is shared between the pairs. Accordingly, each pair of terminals, i.e., the pair of input terminals and the pair of output terminals, comprises the common terminal and a corresponding non-common terminal.

Opposite ends of a feedback circuit are electrically connected between the non-common output terminal and the non-common input terminal of one of the transistors, referred to herein as a closed loop transistor. The opposite ends of the feedback circuit are electrically disconnected from any two terminals of the other one of the transistors, referred to herein as an open-loop transistor. A single-ended input signal is accepted by the amplifier at an input port comprising a signal-carrying input terminal and a ground terminal. The input terminal of the input port is electrically connected to the non-common input terminal of both of the transistors. A differential output signal is provided by the amplifier at an output port comprising a positive terminal and a negative terminal. The positive terminal of the output port is electrically connected to the common terminal of the open-loop transistor and the negative terminal of the output port is electrically connected to non-common output terminal of the closed-loop transistor.

DESCRIPTION OF EXAMPLE EMBODIMENTS

Figure 1:
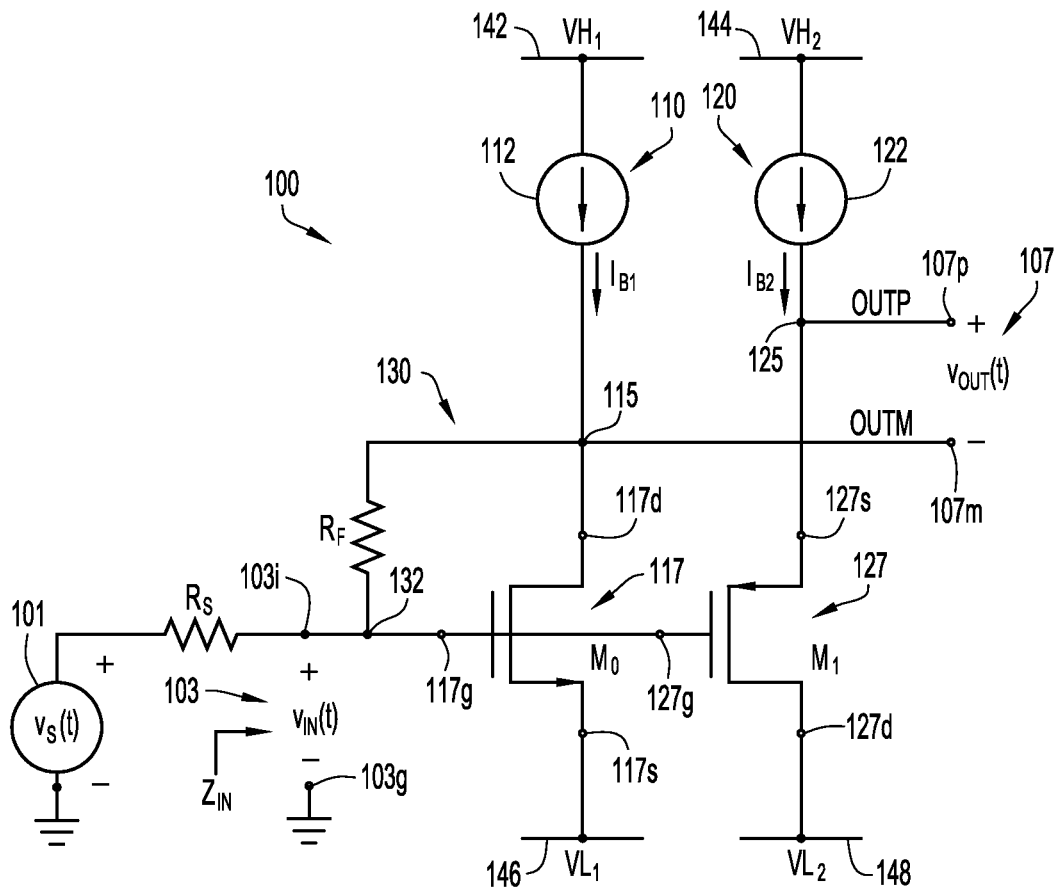
FIG. 1 is a schematic diagram of a low-noise amplifier by which the present general inventive concept can be embodied.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments Certain mathematical expressions are contained herein and those principles conveyed thereby are to be taken as being thoroughly described therewith. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

The techniques described herein are directed to LNAs in RF receivers that receive single-ended input signals, such as on an unbalanced transmission line or on a single conductor, and that produce differential output signals, such as on a balanced transmission line or differential conductor pair. The examples described below are presented in a television receiver front-end context; however, the present invention is not so limited. Upon review of this disclosure and appreciation of the concepts disclosed herein, the ordinarily skilled artisan will recognize other amplifier contexts in which the present inventive concept is applicable. The scope of the present invention is intended to encompass all such alternative implementations.

FIG. 1 is a schematic diagram of an LNA 100 by which the present invention can be embodied. By way of example, LNA 100 may be incorporated into a television receiver, either in the television itself or in a separate unit such as a set-top box, to amplify signals in the very-high frequency (VHF) and ultra-high frequency (UHF) television bands. Exemplary LNA 100 is thus constructed to amplify signals in the frequency range between approximately 50 MHz and 900 MHz. LNA 100 accepts a single-ended input signal $v_{IN}(t)$ at input port 103 and produces a differential output signal $v_{OUT}(t)$ at output port 107. Thus, LNA 100 performs the functions of both amplifier and balun. It is to be noted that while LNA 100 is a multi-stage amplifier, inter-stage capacitors are not utilized, thus reducing the size and cost of the amplifier. Those skilled in the electronics arts will appreciate the physical footprint of a bypass or coupling capacitor for medium RF-frequency applications, such as in VHF/UHF television tuners.

Input port 103 may have an input terminal 103i to which a signal-bearing conductor is connected and a ground terminal 103g connected to a suitable ground conductor. In one embodiment, input port 103 is a coaxial cable jack at which terminal 103i is connected to the center conductor and terminal 103g is connected to the outer conductor of the coaxial cable. In such an embodiment, the input impedance $Z_{IN}$ of LNA 100 may be established so as to match the impedance $Z_S$ of the transmission line, e.g., the aforementioned coaxial cable.

The differential output signal $v_{OUT}(t)$ is provided at output port 107, which may be constructed for electrical connection to a differential pair of conductors, each carrying a corresponding component of the differential signal. In certain embodiments, the differential pair of conductors forms a balanced transmission line, i.e., each conductor having the same characteristic impedance to ground and/or other circuits, but the present invention is not so limited. Output port 107 may have a positive terminal 107p at which a differential signal component $v_{OUTP}(t)$ is provided and a negative terminal 107m at which a differential signal component $v_{OUTM}(t)$ is provided. At output port 107, the differential output signal $v_{OUT}(t)$ is the time-varying voltage between positive terminal 107p and negative terminal 107m, i.e., $v_{OUT}(t)=v_{OUTP}(t)-v_{OUTM}(t)$.

LNA 100 may be fabricated with a pair of transistors M0 and M1, alternatively referred to herein as transistors 117 and 127, respectively. Each of the transistors 117 and 127 has a pair of input terminals between which an input voltage signal is applied. The input terminals of transistor 117 are terminals 117g and 117s at which gate-to-source voltage $v_{gs}$ is applied and those of transistor 127 are terminals 127s and 127g at which source-to-gate voltage $v_{sg}$ is applied. Each of the transistors 117 and 127 also has a pair of output terminals between which a current flows in proportion to the input voltage signal. The output terminals of transistor 117 are terminals 117d and 117s through which a drain current $I_{ds}$ flows and those of transistor 127 are terminals 127s and 127d through which a drain current $I_{sd}$ flows. In exemplary LNA 100, the input terminals and the output terminals of each of the transistors 117 and 127 have a common terminal that is shared between the pairs. That is, each pair of terminals, i.e., the pair of input terminals and the pair of output terminals, comprises the common terminal and a corresponding non-common terminal. The common terminal of transistor 117 is source terminal 117s and, accordingly, the non-common input terminal of transistor 117 is gate terminal 117g and the non-common output terminal of transistor 117 is drain terminal 117d. For transistor 127, the common terminal is drain terminal 127d. The non-common input terminal of transistor 127 is gate terminal 127g and the non-common output terminal of transistor 127 is source terminal 127s. Those skilled in the art will recognize that transistor 117 is in a shunt-feedback common source (SF-CS) configuration and that transistor 127 is in a common drain or source-follower configuration. However, it is to be understood that the present invention is not limited to those specific topologies. For purposes of providing convenient yet distinguishing nomenclature, transistor 117 may be alternatively referred to herein as closed-loop transistor 117 and transistor 127 may be alternatively referred to herein as open-loop transistor 127.

In the example configuration of FIG. 1, transistors 117 and 127 are metal-oxide-semiconductor field-effect transistors (MOSFETs), although the present invention is not so limited. The skilled artisan, recognizing the corresponding common and non-common terminals of other transistor types that are suitable for practicing the present invention, will be enabled to embody the present invention with such other transistor types upon review of this disclosure.

Exemplary LNA 100 includes a feedback circuit 130 that is electrically connected between drain terminal 117d and gate terminal 117g of closed-loop transistor 117. While gate terminals 117g and 127g of both transistors 117 and 127 are electrically short-circuited, feedback circuit 130 is otherwise electrically disconnected from open-loop transistor 127, i.e., feedback circuit 130 is not connected to any two terminals of open-loop transistor 127.

Each of the transistors 117 and 127 is incorporated into a corresponding amplifier stage. As illustrated in FIG. 1, closed-loop transistor 117 is a component of amplifier stage 110, referred to herein as closed-loop amplifier stage 110, and open-loop transistor 127 is a component of amplifier stage 120, referred to herein as open-loop amplifier stage 120. Each amplifier stage 110 and 120 is terminated in a set of voltage rails; closed-loop amplifier stage 110 is terminated in upper and lower voltage rails 142 and 146 and open-loop amplifier stage 120 is terminated in upper and lower voltage rails 144 and 148. As indicated in FIG. 1, upper voltage rails 142 and 144 need not be held at a common potential and the same is true for lower voltage rails 146 and 148. Moreover, the potential difference between upper voltage rail 142 and lower voltage rail 146 need not be the same as the potential difference between upper voltage rail 144 and lower voltage rail 148. The supply voltages on voltage rails 142, 144, 146 and 148 may be prudently selected in accordance with the particular application. Amplifier stages 110 and 120 also include suitable circuitry to generate biasing currents $I_{B1}$ and $I_{B2}$, respectively, from operating power provided on voltage rails 142, 1144, 146 and 148. Such circuitry is representatively illustrated in FIG. 1 by current source 112 and current source 122.

The present invention is not limited to a particular biasing technique and those skilled in the electronics arts will understand and appreciate the impact of the selected biasing mechanism on small signal gain, input and output impedances, etc., without such being explicitly discussed herein.

Amplifier stages 110 and 120 have respective output terminals 115 and 125, respectively. Output terminal 115 is electrically connected to drain terminal 117d of closed-loop transistor 117 and output terminal 125 is electrically connected to source terminal 127s of open-loop transistor 127. Both amplifier stages 110 and 120 concurrently receive input signal $v_{IN}(t)$, concurrently apply independently-established gain to input signal $v_{IN}(t)$, and concurrently provide output signals $v_{OUTM}(t)$ and $v_{OUTP}(t)$ at respective output terminals 115 and 125.

The closed-loop gain applied by amplifier stage 110 will be referred to herein by the symbol $G_0$ and the open-loop gain applied by amplifier stage 120 will be referred to herein by the symbol $G_1$. Accordingly, $v_{OUTP}(t)=G_1 v_{IN}(t)$ and $v_{OUTM}(t)=G_0 v_{IN}(t)$ and $v_{OUT}(t)=[G_1-G_0]\cdot v_{IN}(t)$. The closed-loop gain $G_0$ of an SF-CS amplifier, and thus amplifier stage 110, may be approximated by, $$G_0 \cong -g_{m0}(r_{O0}\|R_{D0}\|R_F) \qquad (1)$$

and open-loop gain $G_1$ of a source follower, and thus amplifier stage 120, may be approximated by, $$G_1 \cong \frac{g_{m1} r_{O1} R_{S1}}{r_{O1} + R_{S1} + g_{m1} r_{O1} R_{S1}}. \qquad (2)$$

where $R_F$ is the feedback resistance, $g_{m0}$ and $g_{m1}$ are the respective transconductances of transistors 117 and 127, $r_{O0}$ and $r_{O1}$ are the respective output resistances of transistors 117 and 127 that account for channel length modulation, $R_{D0}$ is the impedance loading drain terminal 117d, which includes the impedance of the amplifier's target load as well as the impedance of current source 112, $R_{S1}$ is the impedance loading source terminal 127s, which also includes the impedance of the amplifier's target load and the impedance of current source 122, and the operator "$\|$" returns the resistance value of the parallel combination of the operand resistors. The gain $G_0$ can be set through prudent selection of $R_F$ and $R_{D0}$, as well as the biasing point of transistor 117 that, along with the physical construction of transistor 117, establishes $r_{O0}$ and $g_{m0}$. The gain $G_1$ can be set by selection of $R_{S1}$ and the biasing point of transistor 127 that establishes $r_{O1}$ and $g_{m1}$. It is to be noted that the closed-loop gain $G_0$ of closed-loop amplifier stage 110 is negative and that the open-loop gain $G_1$ of amplifier stage 120 is positive as well as being close to unity. Consequently, in the output signal $v_{OUT}(t)$, the difference $[G_1-G_0]\cdot v_{IN}(t)$ results in the desired signal components of $v_{OUTM}(t)$ and $v_{OUTP}(t)$ combining constructively while internally generated noise combines destructively. Additionally, by implementing variable resistance in feedback resistor $R_F$, gain $G_0$ can be made more or less negative under command of, for example, a controller, whereby the difference $[G_1-G_0]$, i.e., the overall gain of LNA 100, can be made larger or smaller.

The input impedance of LNA 100 at input port 103 is the input impedance of closed-loop amplifier stage 110 in parallel with the input impedance of open-loop amplifier stage 120. However, the input impedance of open-loop amplifier stage 120 is very large; it is the gate impedance of open-loop transistor 127. Accordingly, the input impedance of LNA 100 is governed almost entirely by amplifier stage 110, i.e., when various parasitic effects of transistor 127 are taken into account. The input impedance of an SF-CS amplifier, and thus of closed-loop amplifier stage 110, can be approximated by, $$Z_{IN} \cong \frac{R_F + r_{O0}\|R_{D0}}{1 + g_{m0} r_{O0}\|R_{D0}}. \qquad (3)$$

Input impedance $Z_{IN}$ can be set to match the source impedance $Z_S$ by selecting $R_F$ and the biasing point of transistor 117.

Output port 107 is electrically connected to output terminals 115 and 125 of both amplifier stages 110 and 120; positive terminal 117p of output port 107 is electrically connected to output terminal 125 of open-loop amplifier stage 120 and negative terminal 117m of output port 117 is electrically connected to output terminal 115 of closed-loop amplifier stage 110. As discussed above, differential output signal $v_{OUT}(t)$ is provided between positive terminal 117p and negative terminal 117m of output port 117.

Transistors 117 and 127 of exemplary LNA 100 are of complementary fabrication and while closed-loop transistor 117 is an n-channel MOSFET and open-loop transistor 127 a p-channel MOSFET, the present invention is not so limited. In one embodiment, closed-loop transistor 117 is a p-channel MOSFET and open-loop transistor 127 is an n-channel MOSFET. Those skilled in amplifier design will recognize other configurations by which the present invention can be embodied without departing from the spirit and intended scope thereof.

Figure 2A:
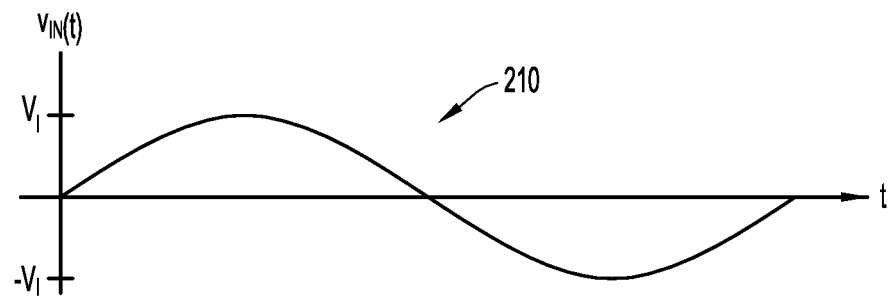
FIGS. 2A-2G are illustrations of signal waveforms demonstrating functionality of embodiments of the present general inventive concept.
Figure 2B:
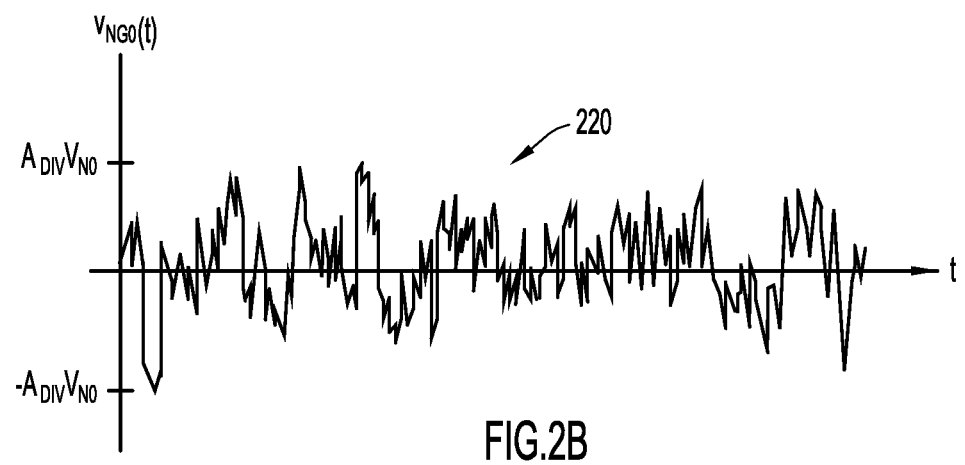
Figure 2C:
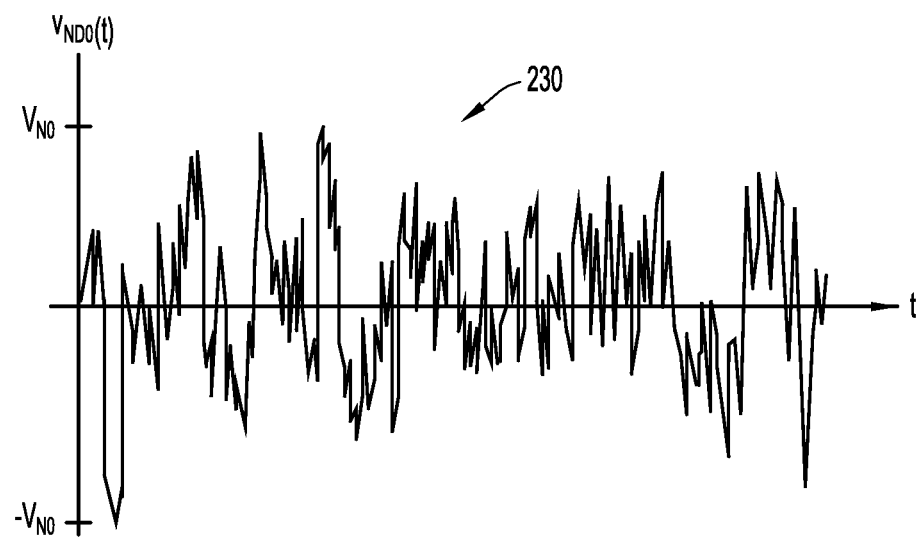

FIGS. 2A-2E, collectively referred to herein as FIG. 2, are illustrations of waveforms by which functionality of embodiments of the present invention can be further explained, using LNA 100 as the example. FIG. 2A is an illustration of an information-bearing signal component 210 of an example input signal $v_{IN}(t)$, albeit much simplified from broadcast television signals. It is to be understood that the term "information-bearing signal" is chosen solely for convenience given the broadcast television tuner in which the present exemplary embodiment is described. The present invention is not limited to signals on which information is conveyed. Information-bearing signal 210, which will also be referred to herein by the symbol $v_{IS}(t)$, may be received from a downstream signal source 101, depicted in FIG. 1, that provides a signal $v_0(t)=V_0(t)\sin(2\pi f_C t)$, where $f_C$ is a carrier frequency of a broadcast television channel and $V_0(t)$ is an amplitude modulation function by which information is encoded on the carrier. It is to be understood that while the present example is presented in an amplitude modulation context, the present invention is not so limited. The information-bearing signal arrives at input port 102 as $v_{IS}(t)=V_f(t)\sin(2\pi f_C t)$, where phase-shifts in the conveyance are ignored. $V_f(t)$ is simply $V_0(t)$ scaled by the voltage divider formed from the real part of source impedance $Z_S$, representatively illustrated as source resistor $R_S$ in FIG. 1, and the real part of input impedance $Z_{IN}$, representatively referred to herein as input resistance $R_{IN}$ (not illustrated).

M0 noise is generated by closed-loop transistor 117 and includes, among other things, flicker noise (also referred to as 1/f noise), thermally-induced channel noise, thermally-induced noise from the resistive substrate, and shot noise from the p-n junctions at the source and drain. These mechanisms manifest themselves as fluctuations in the flow of drain current through closed-loop transistor 117, which follows a path from drain terminal 117d, through feedback circuit 130, through source resistor $R_S$ and then to signal ground at signal source 101. Feedback resistor $R_F$ and source resistor $R_S$ form a voltage divider in the drain current path and, consequently, a noise voltage appears at output terminal 115, referred to herein by the symbol $v_{ND0}(t)$ and representatively illustrated as noise signal 230 in FIG. 2C, and at circuit node 132, referred to herein as noise signal $v_{NG0}(t)=A_{DIV} \cdot v_{ND0}(t)$, where $A_{DIV}$ is a scaling factor introduced by the voltage divider of $R_S$ and $R_F$, i.e., $A_{DIV}=R_S/R_F+R_S$). M0 noise signal $v_{NG0}(t)$ is representatively illustrated as noise signal 220 in FIG. 2B. The voltage at input port 103 of LNA 100 is the sum of information-bearing signal 210 and noise signal 220, i.e., $v_{IN}(t)=v_{IS}(t)+v_{NG0}(t)=v_{IS}(t)+A_{DIV} \cdot v_{ND0}(t)$.

Figure 2D:
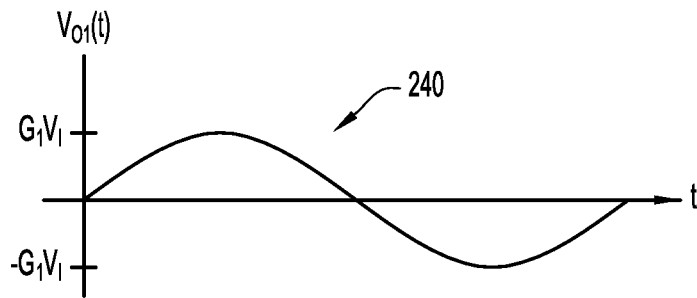
Figure 2E:
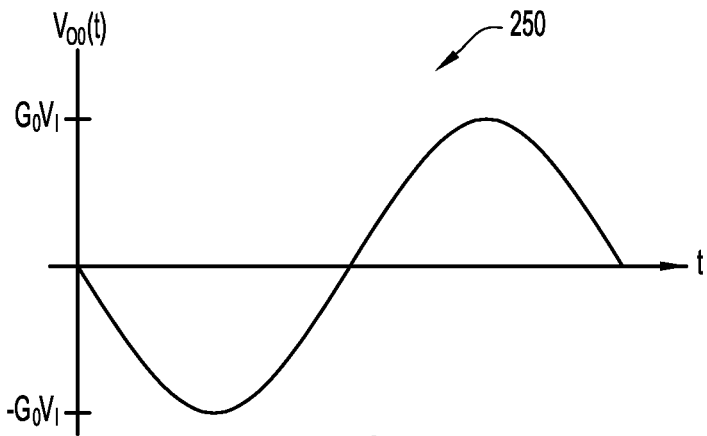
Figure 2F:
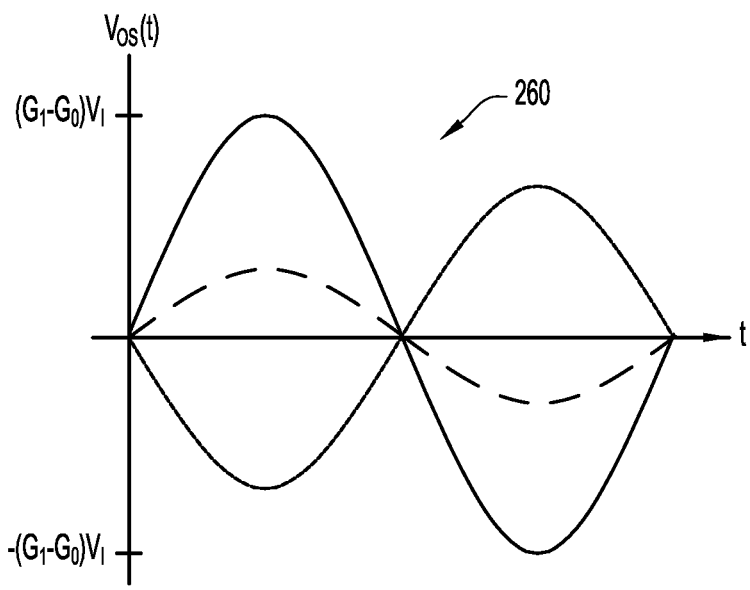

FIG. 2D illustrates an information-bearing signal component 240 of $v_{OUTP}(t)$, referred to herein as $v_{O1}(t)$. FIG. 2E illustrates information-bearing signal component 250 of $v_{OUTM}(t)$, referred to herein as $v_{OO}(t)$. The information-bearing component of $v_{OUT}(t)$, alternatively referred to herein by the symbol $v_{OS}(t)$, is illustrated in FIG. 2F as information-bearing output signal 260 and is shown overlaid on the signals $v_{O1}(t)$ and $v_{OO}(t)$ from which it is derived. It is to be observed that in the difference $v_{OS}(t)=v_{O1}(t)-v_{OO}(t)$, the signals $v_{O1}(t)$ and $v_{OO}(t)$ combine constructively.

Figure 2G:
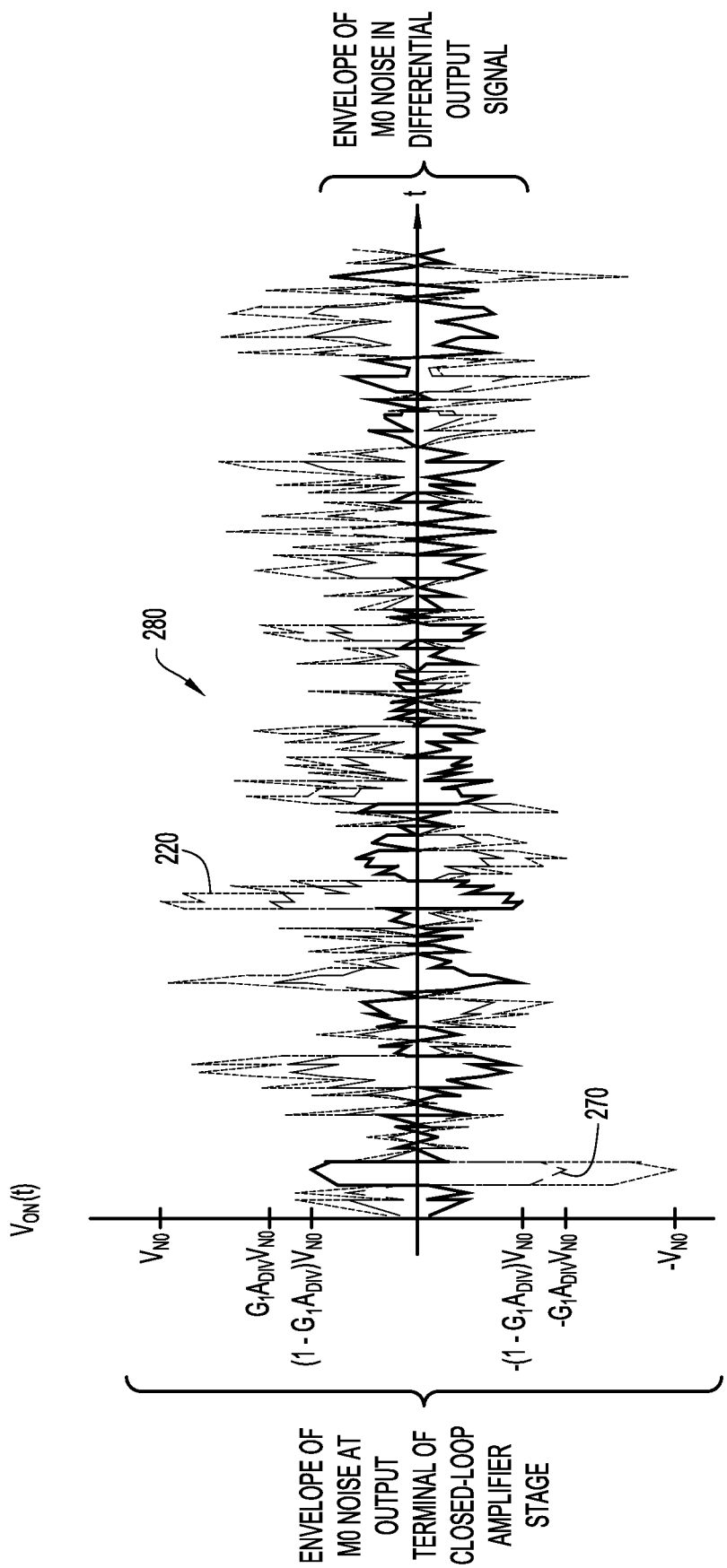

FIG. 2G illustrates M0 noise output signal 280, alternatively referred to herein by the symbol $v_{ON}(t)$, overlaid on M0 noise components of $v_{OUTP}(t)$ and $v_{OUTM}(t)$. The M0 noise component of $v_{OUTM}(t)$ is the M0 noise voltage at output terminal 115 of closed-loop amplifier stage 110, i.e., $v_{ND0}(t)$. The M0 noise component of $v_{OUTP}(t)$, illustrated in FIG. 2G as M0 noise signal 270, begins as M0 noise $v_{NG0}(t)$ presented on gate terminal 127g of open-loop transistor 127 by way of its connection with circuit node 132. Noise signal $v_{NG0}(t)$ modulates the source current in transistor 127 to generate an M0 noise signal $v_{NS1}(t)=G_1 v_{NG0}(t)$ at output terminal 125. At output port 107, the M0 noise voltage $v_{ON}(t)=v_{NS1}(t)-v_{ND0}(t)=(A_{DIV} \cdot G_1-1) \cdot v_{ND0}(t)$. It is to be noted that the M0 noise signal is not influenced by closed-loop gain $G_0$ of amplifier stage 110 and thus does not undergo inversion. Consequently, in the difference $v_{OUTP}(t)|v_{OUTM}(t)$, the noise components $v_{NS1}(t)$ and $v_{ND0}(t)$ combine destructively and M0 noise of an LNA embodying the present invention is substantially reduced over the M0 noise of a comparable single-ended input single-ended output SF-CS amplifier.

Figure 3:
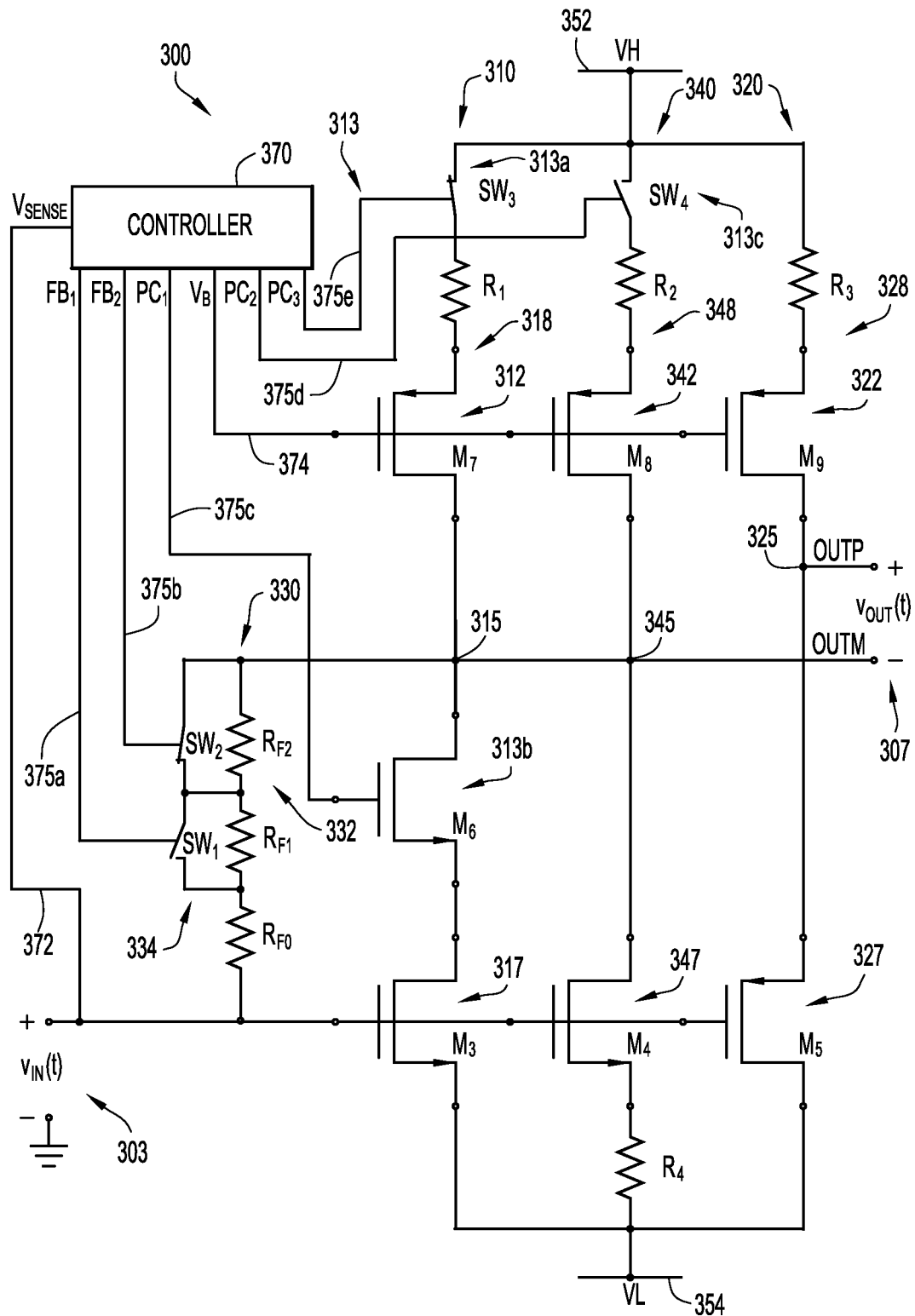
FIG. 3 is a schematic diagram of another low-noise amplifier by which the present general inventive concept can be embodied.

FIG. 3 is a schematic diagram of a variable-gain LNA 300 by which the present invention can be embodied. LNA 300 includes an input port 303 at which a single-ended input signal $v_{IN}(t)$ is accepted and an output port 307 at which a differential output signal $v_{OUT}(t)$ is provided to external circuitry (not illustrated). Input port 303 and output port 307 may be constructed in a manner similar input port 103 and output port 107 illustrated in FIG. 1. LNA 300 also includes at least one closed-loop amplifier stage 310 and 340 and an open-loop amplifier stage 320. Closed-loop amplifier stages 310 and 340 may operate in a manner similar to closed-loop amplifier stage 110 in FIG. 1 and open-loop amplifier stage 320 may operate in a manner similar to open-loop amplifier stage 120, with certain differences being explained below.

Amplifier stages 310, 320 and 340 are commonly connected to an upper voltage rail 352 and a common lower voltage rail 354. Biasing current in each amplifier stage 310, 320 and 340 is established by current sources circuits 318, 328 and 348, respectively, comprising respective transistors 312, 322 and 342, and respective resistors $R_1$, $R_2$ and $R_3$. Transistors 312, 322 and 344 are commonly connected at their gate terminals to control signal conductor 374 on which controller 370 may provide a bias current control signal $V_B$. The voltages on the gate terminals of transistors 312, 322 and 324 are held at a common voltage $V_B$ and the voltages on the source terminals of transistors 312, 322 and 324 are established by respective resistors $R_1$, $R_2$ and $R_3$. Resistors $R_1$-$R_3$ can be prudently selected to establish distinct source-to-gate voltages $V_{SG}$ on each transistor 312, 322 and 342 and, thereby, establish distinct biasing currents from respective current source circuits 318, 328 and 348.

LNA 300 includes a feedback circuit 330 that implements variable resistance in $R_F$ by which closed-loop gain $G_0$ can be varied as discussed above. Exemplary feedback circuit 330 implements selectable resistance levels and is constructed from a resistor circuit 332 comprising series-connected resistors $R_{F0}$-$R_{F2}$ and a selectable bypass circuit 334 comprising series-connected switches $SW_1$-$SW_2$. As illustrated in the FIG. 3, resistor circuit 332 and bypass circuit 334 are electrically connected at circuit nodes that are electrically interposed between series-connected switches $SW_1$-$SW_2$ and electrically interposed between series-connected resistors $R_{F0}$-$R_{F2}$. Switches $SW_1$-$SW_2$ may be operated into conducting and non-conducting states in response to feedback control signals $FB_1$ and $FB_2$ generated by controller 370 and provided to switches $SW_1$-$SW_2$ on control signal conductors 375a-375b. It is to be understood that while feedback circuit 330 incorporates three resistors and two switches, the present invention is not so limited. A variable resistance structure similar to that illustrated in FIG. 3 may include as many switches and resistors as required to implement the desired range of resistance levels. Moreover, other mechanisms may be used to implement variable resistance in feedback circuit 330 without departing from the spirit and intended scope of the present invention, as will be appreciated by the skilled artisan upon review of this disclosure.

Closed-loop amplifier stages 310 and 340 are commonly connected to feedback circuit 330. LNA 300 includes a path control circuit 313 that establishes which of closed-loop stages 310 and 340 applies the closed-loop gain $G_0$ to $v_{IN}(t)$ and provides differential signal component $v_{OUTM}(t)$ to output port 307. Path control circuit 313 includes switches 313a and 313b in closed-loop amplifier stage 310 and switch 313c in closed loop amplifier stage 340. Switches 313a-313c can be operated into a conducting state or a non-conducting state by path control signals $PC_1$-$PC_3$ issued by controller 370 on control signal conductors 375c-375e. In certain embodiments, path control circuit 313 is operated by controller 370 so that only one closed-loop amplifier stage 310 or 340 is activated at any given moment to provide $v_{OUTM}(t)$ to output port 307. For example, to activate closed-loop amplifier stage 310, controller 370 generates suitable path control signals $PC_1$-$PC_3$ to compel switches 313a and 313b into their conducting states, while switch 313c is compelled into its non-conducting state. Consequently, no current is provided to closed-loop transistor 347 from current source 348 and, since closed-loop transistor 317 is self-biased through feedback circuit 330, there is insufficient current available to transistor 347 from current source 318 owing to the presence of resistor $R_4$ to activate transistor 347. To activate closed-loop amplifier stage 340, controller 370 generates suitable path control signals $PC_1$-$PC_3$ to compel switches 313a and 313b into their non-conducting states, while switch 313c is compelled into its conducting state. Switch 313b, in its non-conducting state, prevents transistor 317 from drawing drain current from current source 348 through short-circuited output terminals 315 and 345 and thus deactivates transistor 317.

In embodiments implementing a single closed-loop amplifier stage 310, path control circuit 313 can be omitted. When so embodied, LNA 300 resembles LNA 100 in both structure and function with variable gain achieved by variable resistance of $R_F$.

Closed-loop amplifier stage 340 implements resistive source degeneration on transistor 347 by way of resistor $R_4$. Those with skill in electronic amplifiers will recognize that such source degeneration decreases the gain of closed-loop amplifier stage 340 when compared with the gain of a non-degenerated amplifier stage, such as closed-loop amplifier stage 310. Accordingly, LNA 300 implements one range of closed-loop gain by varying resistance $R_F$ while closed-loop amplifier stage 310 is active and another range of gain by varying resistance $R_F$ while closed-loop amplifier stage 340 is active.

In certain embodiments, biasing circuits 318 and 348 may be combined into a single biasing circuit controlled by a single switch that replaces switches $SW_3$ and $SW_4$. When so embodied, path control circuit 313b may be used to select which one of amplifier stages 310 and 340 is activated, as described above. Additionally, when all biasing current is removed from both amplifier stages 310 and 340, e.g., opening $SW_3$ and $SW_4$ (or the single switch that combines the functionality of $SW_3$ and $SW_4$), and $R_F$ is of sufficiently high resistance, $v_{OUTM}(t)$ can be made to essentially 0V and the differential output voltage $v_{OUT}(t)=v_{OUTP}(t)-v_{OUTM}(t)=v_{IN}(t)-0=v_{IN}(t)$.

Controller 370 may be implemented in suitable circuitry to implement gain control functionality for LNA 300. Controller 370 may be fabricated from analog circuits, digital circuits, or a combination of analog and digital circuits, as well as circuitry that interfaces analog signals to digital circuits, and vice-versa. Fixed and/or programmable logic may be included in controller 370 including, but not limited to field-programmable logic, application-specific integrated circuits, microcontrollers, microprocessors and digital signal processors. Embodiments of controller 370 may be fabricated to execute a process stored in a memory (not illustrated) as executable processor instructions. Controller 370 may be a portion of a broader control circuit that implements control over other functions of the receiver in which LNA 300 is incorporated.

Figure 4:
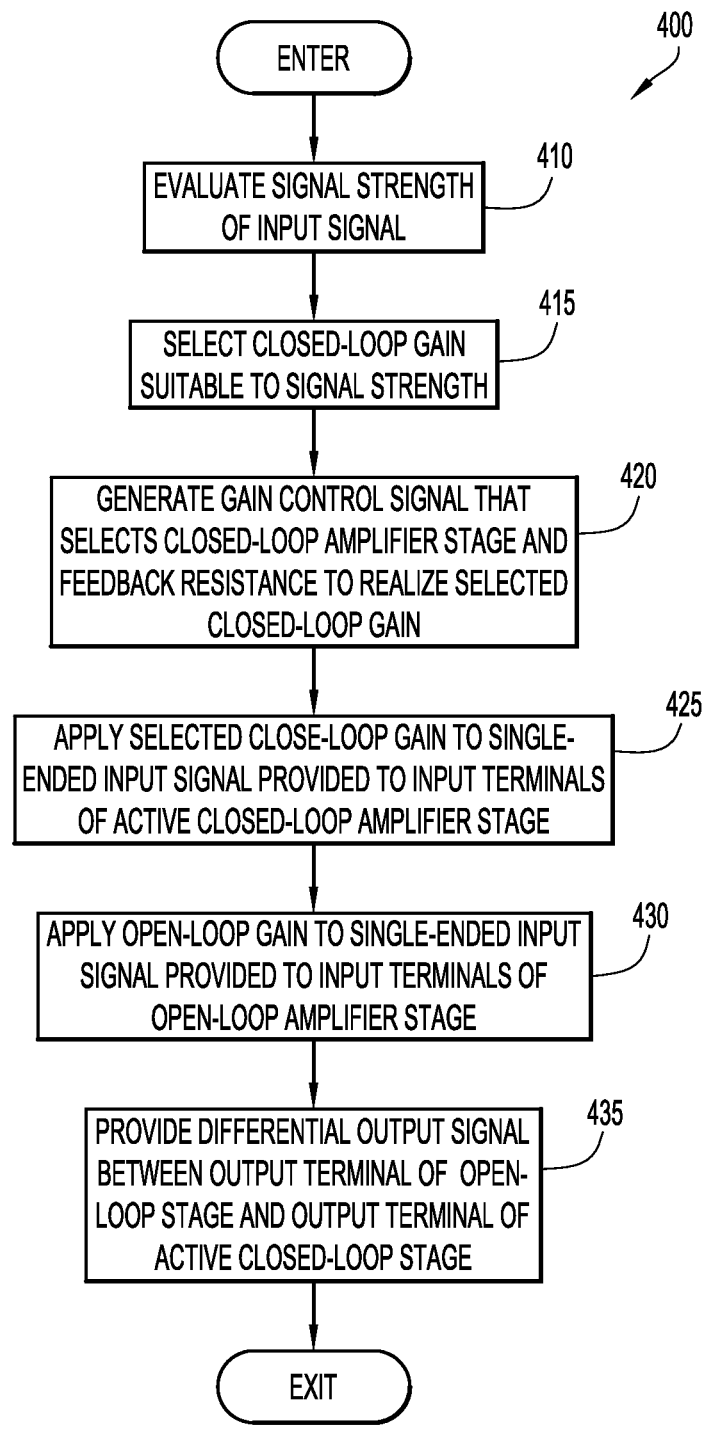
FIG. 4 is a flow diagram of an amplification process by which the present general inventive concept can be embodied.

Operation of LNA 300 is further explained with reference to FIG. 4, which is a flow diagram of an exemplary amplification process 400. In operation 410, the signal strength of input signal $v_{IN}(t)$ is evaluated. For example, LNA 300 in FIG. 3 includes a sensing conductor 372 on which $v_{IN}(t)$ is monitored as signal $V_{SENSE}$ by voltage sensing circuitry in controller 370. Such sensing circuitry may include peak detectors, envelope detectors, etc. by which the amplitude of $v_{IN}(t)$ is assessed. It is to be understood that while $V_{SENSE}$ is illustrated as being obtained from input port 303, such is solely for purposes of explanation. $V_{SENSE}$ may be obtained elsewhere if input loading of the sensing circuitry is to be avoided such as, for example, at the output 325 of open-loop amplifier stage 320, either of outputs 315 or 345 of closed-loop amplifier stages 310 and 340, respectively, or at other connections in a system in which the LNA is incorporated. The skilled artisan will recognize numerous possibilities for monitoring input voltage levels that can be used in conjunction with the present invention without departing from the spirit and intended scope thereof.

Subsequent to sensing input voltage $v_{IN}(t)$ in operation 410, amplification process 400 transitions to operation 415, by which a gain setting is selected that amplifies $v_{IN}(t)$ to meet some amplification criteria, e.g., one that maximizes the signal amplitude without distortion. In operation 420, controller 370 generates a gain control signal that realizes the selected gain. As used herein, a gain control signal is the combined signal states of path control signals $PC_1$-$PC_3$ and feedback control signals $FB_1$-$FB_2$ and is conveyed on control signal conductors 375a-375e. The gain control signal activates one of closed-loop amplifier stages 310 and 340 and establishes the feedback resistance of $R_F$ by establishing which of resistors $R_{F0}$-$R_{F2}$ are bypassed, if any, by switches $SW_1$-$SW_2$. In operation 425, the selected closed-loop gain $G_0$ is applied to $v_{IN}(t)$ as provided at the input terminals of the active closed-loop amplifier stage 310 or 340. In operation 430, open-loop gain $G_1$ is applied to $v_{IN}(t)$ as provided at the input terminals of open-loop amplifier stage 320. In operation 435, differential output signal $v_{OUT}(t)$ is provided between the output terminal of open-loop amplifier stage 320 and the output terminal of the active closed-loop amplifier stage 310 or 340, which, as illustrated in FIG. 3, may be a commonly-connected circuit node. It is to be understood that amplification process 400 may be repeated continuously to dynamically adapt the applied gain to changing signal strength of the incoming signal $v_{IN}(t)$.

Figure 5:
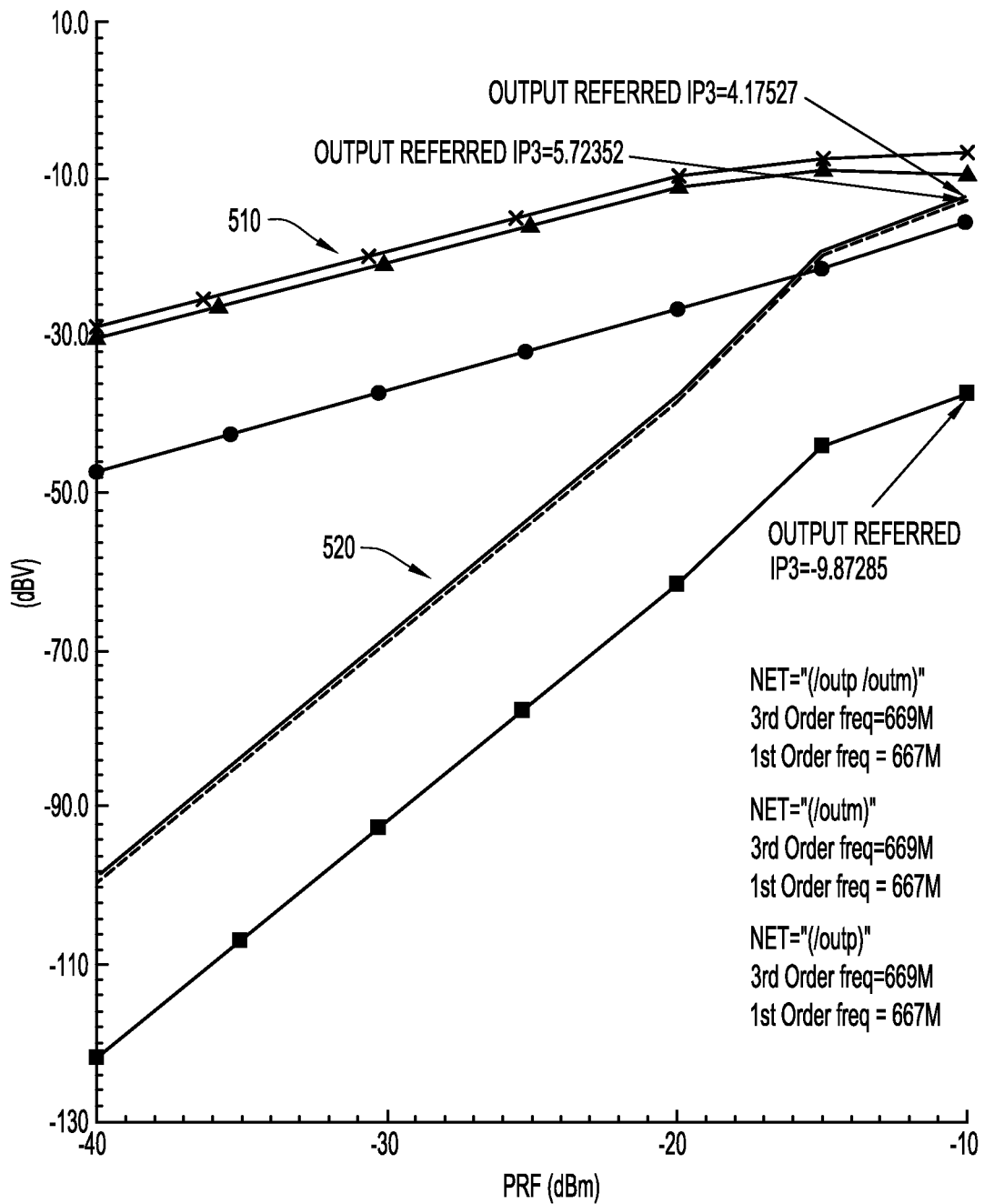
FIG. 5 is a graph demonstrating amplifier linearity of embodiments of the present general inventive concept.

In FIG. 5, it is illustrated that a single-ended input differential output (SIDO) LNA constructed in accordance with the present invention is more linear than either of a comparable single-ended input single-ended output (SISO) SF-CS amplifier stage or SISO source follower amplifier stage. The set of curves 510 represent the fundamental response of the SISO stages along with that of a SIDO LNA embodiment of the present invention. The set of curves 520 represent the output referred third-order response of the same amplifier stages. It is to be noted that the third-order intercept point IP3 is almost 2 dB higher in the SIDO LNA over the SISO SF-CS amplifier alone.

Figure 6:
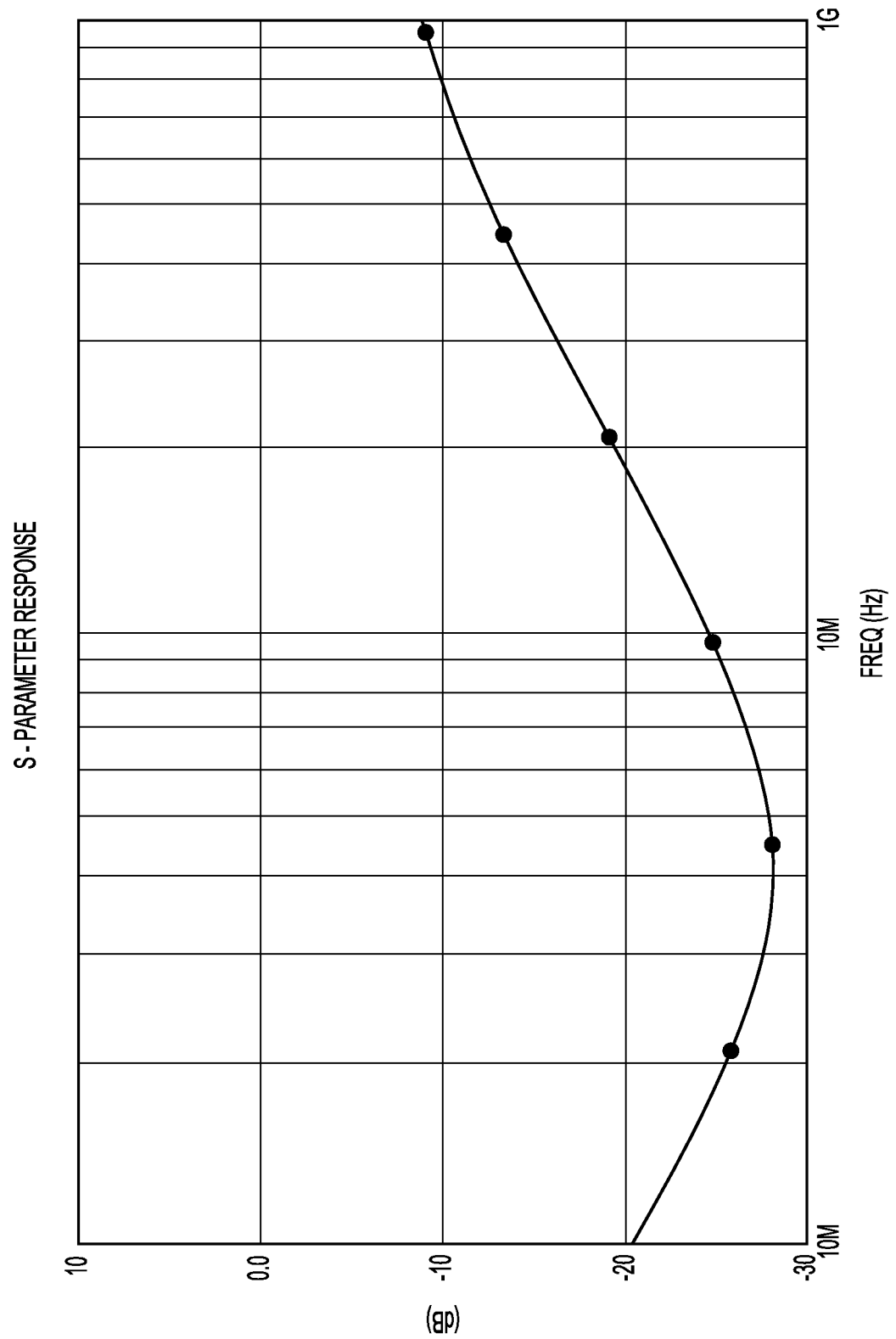
FIG. 6 is a graph demonstrating wideband impedance matching by embodiments of the present general inventive concept.

FIG. 6 is a graph illustrating the input return loss of a SIDO LNA embodying the present invention connected for $Z_{IN}=75\Omega$ evaluated over a range of frequencies encompassing the VHF and UHF television bands. As illustrated in FIG. 6, the impedance match is acceptable over the entire frequency range of interest.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions may be encoded and then subsequently retrieved, decoded and executed by a processor, including electrical, magnetic and optical storage devices. Examples of non-transitory computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present general inventive concept as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An amplifier comprising:
a pair of transistors each having a pair of input terminals between which an input voltage signal is applied and each having a pair of output terminals between which a current flows in proportion to the input voltage signal, the input terminals and the output terminals sharing a common terminal such that each of the input terminals and the output terminals comprise the common terminal and a corresponding non-common terminal;
a feedback circuit electrically connected at opposite ends thereof between the non-common output terminal and the non-common input terminal of a closed-loop one of the transistors, the opposite ends of the feedback circuit being electrically disconnected from any two terminals of an open-loop one of the transistors;
an input port comprising a signal-carrying input terminal and a ground terminal between which a single-ended input signal is accepted, the input terminal of the input port being electrically connected to the non-common input terminal of both of the transistors; and
an output port comprising a positive terminal and a negative terminal between which a differential output signal is provided, the positive terminal of the output port being electrically connected to the non-common terminal of the open-loop transistor and the negative terminal of the output port being electrically connected to the non-common output terminal of the closed-loop transistor.

2. The amplifier of claim 1, wherein the feedback circuit comprises at least one resistor between the opposite ends thereof.

3. The amplifier of claim 2, wherein the resistance of the resistor is selectively variable responsive to a gain control signal.

4. The amplifier of claim 3, wherein the feedback circuit is devoid of reactive circuit components.

5. The amplifier of claim 4, further comprising:
an additional transistor having the pair of input terminals and the pair of output terminals sharing a common terminal such that each of the input terminals and the output terminals comprise the common terminal and the corresponding non-common terminal, the non-common input terminal of the additional transistor being electrically connected to the non-common input terminal of the closed-loop transistor and to the non-common input terminal of the open-loop transistor, the non-common output terminal of the additional transistor being electrically connected to the non-common output terminal of the closed-loop transistor and electrically disconnected from all terminals of the open-loop transistor;
at least one resistor electrically connected to the common terminal of the additional transistor in series with the pair of output terminals thereof; and
switching components electrically connected in series with the output terminals of the closed-loop transistor and the output terminals of the additional transistor, the switching components being compelled into conducting and non-conducting states responsive to the gain control signal to selectively provide bias current to one of the closed-loop transistor or the additional transistor.

6. The amplifier of claim 5, wherein the gain control signal comprises a set of path control signals in accordance with which one of the closed-loop amplifier stage and the other closed-loop amplifier stage is activated through the switching components and a set of feedback control signals in accordance with which the resistance of the feedback circuit is established.

7. The amplifier of claim 1, wherein the common terminal of the closed-loop transistor is a metal-oxide-semiconductor field effect transistor (MOSFET) drain terminal and the common terminal of the open-loop transistor is a MOSFET source terminal.

8. The amplifier of claim 7, wherein the closed-loop transistor is an n-channel MOSFET and the open-loop transistor is a p-channel MOSFET.

9. An amplifier comprising:
a closed-loop gain stage comprising:
a closed-loop transistor having a pair of input terminals between which an input voltage signal is applied and a pair of output terminals between which a current flows in proportion to the input voltage signal, the input terminals and the output terminals sharing a common terminal such that each of the input terminals and the output terminals comprise the common terminal and a corresponding non-common terminal;
a feedback circuit electrically connected at opposite ends thereof between the non-common output terminal and the non-common input terminal of the closed-loop transistor;
an open-loop gain stage comprising an open-loop transistor having the pair of input terminals and the pair of output terminals sharing a common terminal such that each of the input terminals and the output terminals comprise the common terminal and the corresponding non-common terminal;
an input port comprising an input terminal and a ground terminal between which a single-ended input signal is accepted, the input terminal of the input port being electrically connected to both the non-common input terminal of the closed-loop transistor and the non-common input terminal of the open-loop transistor;
an output port comprising a positive output terminal and a negative output terminal between which a differential output signal is provided, the positive output terminal of the output port being electrically connected to the non-common terminal of the open-loop transistor and the negative output terminal of the output port being electrically connected to the non-common output terminal of the closed-loop transistor.

10. The amplifier of claim 9, wherein the feedback circuit comprises at least one resistor between the opposite ends thereof.

11. The amplifier of claim 10, wherein the resistance of the resistor is selectively variable responsive to a gain control signal.

12. The amplifier of claim 11, further comprising:
another closed-loop amplifier stage comprising:
an additional transistor having the pair of input terminals and the pair of output terminals sharing a common terminal such that each of the input terminals and the output terminals comprise the common terminal and the corresponding non-common terminal, the common input terminal of the additional transistor being electrically connected to the common input terminal of the closed-loop transistor and to the common input terminal of the open-loop transistor, the non-common output terminal of the additional transistor being electrically connected to the non-common output terminal of the closed-loop transistor and electrically disconnected from all terminals of the open-loop transistor; and at least one resistor electrically connected to the common terminal of the additional transistor in series with the pair of output terminals thereof; and a path selection circuit comprising switching components electrically connected in series with the output terminals of the closed-loop transistor and the output terminals of the additional transistor, the switching components being compelled into conducting and non-conducting states responsive to the gain control signal to selectively activate one of the closed-loop transistor or the additional transistor to apply closed-loop gain to the input signal.

13. The amplifier of claim 12, wherein the gain control signal comprises a set of path control signals in accordance with which one of the closed-loop amplifier stage and the other closed-loop amplifier stage is activated through the path selection circuit and a set of feedback control signals in accordance with which the resistance of the feedback circuit is established.

14. The amplifier of claim 13, further comprising:
a controller configured to generate the gain control signal in accordance with signal strength of the input signal.

15. The amplifier of claim 9, wherein the common terminal of the closed-loop transistor is a metal-oxide-semiconductor field effect transistor (MOSFET) drain terminal and the common terminal of the open-loop transistor is a MOSFET source terminal.

16. The amplifier of claim 15, wherein the closed-loop transistor is an n-channel MOSFET and the open-loop transistor is a p-channel MOSFET.

17. A method of amplifying a single-ended input signal into a differential output signal by an amplifier, the method comprising:
selecting a gain by which the input signal is amplified so as to meet an amplification criterion;

generating a gain control signal that establishes a feedback resistance common to at least one closed-loop amplifier stage of the amplifier in accordance with the selected gain, the feedback resistance realizing closed-loop gain in the closed-loop amplifier stage;

applying the closed-loop gain to the input signal as provided at input terminals of the closed-loop amplifier stage;

applying open-loop gain to the input signal as provided at input terminals of an open-loop amplifier stage of the amplifier; and providing the differential output signal between an output terminal of the open-loop amplifier stage and an output terminal of the closed-loop amplifier stage.

18. The method of claim 17, wherein generating the gain control signal comprises:
generating the gain control signal to activate one of a plurality of closed-loop amplifier stages all commonly connected to the feedback circuit, each of the closed-loop amplifier stages incorporating a distinct resistance outside the feedback circuit that in combination with a range over which the resistance of the feedback circuit can be varied, defines a gain range at least partially non-overlapping with the gain range of the other closed-loop amplifier stages.

19. The method of claim 18, wherein applying the closed-loop gain comprises:
applying the closed-loop gain to the input signal as provided at the input terminals of the active closed-loop amplifier stage.

20. The method of claim 17, further comprising:
evaluating signal strength of the input signal; and
selecting the gain so that the input signal at the evaluated signal strength is amplified to meet the amplification criterion.

* * * * *